United States Patent
Hsuan et al.

(10) Patent No.: US 9,419,160 B2
(45) Date of Patent: Aug. 16, 2016

(54) NITRIDE SEMICONDUCTOR STRUCTURE

(71) Applicant: Episil-Precision Inc., Hsinchu (TW)

(72) Inventors: Jung Hsuan, Hsinchu (TW); Chih-Wei Hu, Hsinchu (TW); Yi-Jen Chan, Hsinchu (TW)

(73) Assignee: Episil-Precision Inc., Hsinchu (TW)

( * ) Notice: Subject to any disclaimer, the term of this patent is extended or adjusted under 35 U.S.C. 154(b) by 0 days.

(21) Appl. No.: 14/623,504

(22) Filed: Feb. 17, 2015

(65) Prior Publication Data

US 2016/0020346 A1 Jan. 21, 2016

(30) Foreign Application Priority Data

Jul. 17, 2014 (TW) .............................. 103124565 A

(51) Int. Cl.
*H01L 31/0304* (2006.01)
*H01L 31/0352* (2006.01)
*H01L 31/0312* (2006.01)

(52) U.S. Cl.
CPC ...... *H01L 31/03046* (2013.01); *H01L 31/0312* (2013.01); *H01L 31/035281* (2013.01)

(58) Field of Classification Search
CPC ....................... H01L 31/03046; H01L 31/0312
See application file for complete search history.

(56) References Cited

U.S. PATENT DOCUMENTS

| 7,014,710 | B2 | 3/2006 | Fang et al. |
| 7,863,172 | B2 | 1/2011 | Zhu et al. |
| 7,956,370 | B2 | 6/2011 | Pan |
| 2003/0232487 | A1* | 12/2003 | Letertre ................. C30B 25/02 438/459 |
| 2006/0138448 | A1* | 6/2006 | Komiyama ....... H01L 21/02381 257/103 |
| 2012/0187540 | A1* | 7/2012 | Hooper ............... H01L 21/0237 257/615 |
| 2013/0221327 | A1 | 8/2013 | Saxler et al. |
| 2014/0001438 | A1* | 1/2014 | Kim ...................... H01L 29/151 257/18 |
| 2014/0103354 | A1* | 4/2014 | Hu ...................... H01L 29/2003 257/76 |

FOREIGN PATENT DOCUMENTS

TW 201251111 12/2012
TW I400810 7/2013

* cited by examiner

Primary Examiner — Lex Malsawma
(74) Attorney, Agent, or Firm — Jianq Chyun IP Office

(57) ABSTRACT

A nitride semiconductor structure is provided. The nitride semiconductor structure includes a substrate, a SiC nucleation layer, a composite buffer layer and a nitride semiconductor layer. The SiC nucleation layer is located on the substrate. The composite buffer layer is located on the SiC nucleation layer. The nitride semiconductor layer is located on the composite buffer layer. Besides, the nitride semiconductor structure is an AlN free semiconductor structure.

18 Claims, 3 Drawing Sheets

NITRIDE SEMICONDUCTOR STRUCTURE

CROSS REFERENCE TO RELATED APPLICATION

This application claims the priority benefit of Taiwan application serial no. 103124565, filed on Jul. 17, 2014. The entirety of the above-mentioned patent application is hereby incorporated by reference herein and made a part of specification.

BACKGROUND OF THE INVENTION

1. Technical Field

The disclosure generally relates to a semiconductor structure, and, more particularly, to a nitride semiconductor structure.

2. Description of Related Art

In recent years, nitride photodiodes have been broadly used in various fields. In a nitride semiconductor structure, since the silicon substrate bears the merits of high thermal conductivity and low cost, a large dimension nitride semiconductor structure with a silicon substrate as a base is an essential element in a nitride photodiode.

Using a gallium nitride semiconductor layer as an exemplary illustration, the lattice difference between a gallium nitride semiconductor layer and a silicon substrate is about 17%, and the difference in thermal expansion coefficients between the two is about 54%. Aside from creating a rupture on the thin film due to the excessive thermal stress generated during the cooling period, the above differences may also generate internal strain in the gallium nitride semiconductor layer during the epitaxy process, resulting in a cracking of the thin film and a formation of defects. Accordingly, resolving the incompatibilities of lattices and thermal expansion coefficients between a nitride semiconductor layer and a silicon substrate to mitigate the rupture of wafers and to obviate the generation of defects is still an issue for the industry to endeavour.

SUMMARY OF THE INVENTION

The disclosure is directed to a nitride semiconductor substructure, in which the incompatibilities of lattices and thermal expansion coefficients between a nitride semiconductor layer and a silicon substrate are improved to reduce the rupture of wafers and obviate the generation of defects.

An exemplary embodiment of the disclosure provides a nitride semiconductor structure. The nitride semiconductor structure includes a substrate, a silicon carbide nucleation layer, a composite buffer layer and a nitride semiconductor layer. The silicon carbide nucleation layer is located on the substrate. The composite buffer layer is located on the silicon carbide nucleation layer. The nitride semiconductor layer is located on the composite buffer layer. Further, the nitride semiconductor structure is an aluminium nitride free (AlN free) semiconductor structure.

According to the above exemplary embodiment of the disclosure, the above composite buffer layer includes a first buffer layer and a second buffer layer, and the first buffer layer is in contact with the silicon carbide nucleation layer.

According to the above exemplary embodiment of the disclosure, the above first buffer layer includes an $Al_xGaN$ layer, wherein $0<x<1$.

According to the above exemplary embodiment of the disclosure, the above second buffer layer includes a plurality of $Al_yGa_{1-y}N$ layers and a plurality of $Al_zGa_{1-z}N$ layers alternately arranged with each other, wherein $0<y<1$, $0<z<1$, and y is not equal to z.

According to the above exemplary embodiment of the disclosure, wherein $x>(y+z)/2$.

According to the above exemplary embodiment of the disclosure, wherein the above second buffer layer includes an aluminium gallium nitride bulk layer.

According to the above exemplary embodiment of the disclosure, the above second buffer layer includes a graded aluminium gallium nitride layer with step graded aluminum content.

According to the above exemplary embodiment of the disclosure, the above second buffer layer includes a graded aluminium gallium nitride layer with continuously graded aluminum content.

According to the above exemplary embodiment of the disclosure, the above buffer layer further includes a third buffer layer positioned between the nitride semiconductor layer and the second buffer layer.

According to the above exemplary embodiment of the disclosure, the third buffer layer includes a silicon carbide layer.

According to the above exemplary embodiment of the disclosure, the third buffer layer includes a plurality of silicon carbide layers and a plurality gallium nitride layer alternately arranged with each other.

According to the above exemplary embodiment of the disclosure, the thickness of the third buffer layer is between 5 nanometers and 100 nanometers.

According to the above exemplary embodiment of the disclosure, the above silicon carbide nucleation layer has a cubic lattice.

According to the above exemplary embodiment of the disclosure, the thickness of the above silicon carbide nucleation layer is between 50 nanometers and 3000 nanometers.

According to the above exemplary embodiment of the disclosure, the thickness of the first buffer layer is between 0.1 micron and 3 microns.

According to the above exemplary embodiment of the disclosure, the thickness of the second buffer layer is between 0.1 micron and 3 microns.

According to the above exemplary embodiment of the disclosure, the total thickness of the first buffer layer and the second buffer layer is between 0.2 micron and 4 microns.

According to the above exemplary embodiments of the disclosure, the material of the above substrate includes silicon, aluminium oxide, or glass.

According to the above exemplary embodiments of the disclosure, the above substrate is a patterned substrate.

According to the above exemplary embodiments of the disclosure, the thickness of the above nitride semiconductor layer is between about 1 micron and 8 microns.

According to the nitride semiconductor structure of the disclosure, through the disposition of the silicon carbide nucleation layer and the composite buffer layer, the incompatibilities of the lattices and the thermal expansion coefficients between gallium nitride and silicon are improved to overcome the problem of excessive defects present between the two. Moreover, the conventional nitride semiconductor structure typically includes aluminium nitride, and the epitaxy process time in forming aluminium nitride by MOCVD is long, resulting in a low throughput of the equipment. According to the disclosure, a nitride semiconductor structure, which is aluminium nitride free, is provided; hence, the epitaxy process time is reduced and the frequency of preventive maintenance of the equipment is also reduced.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
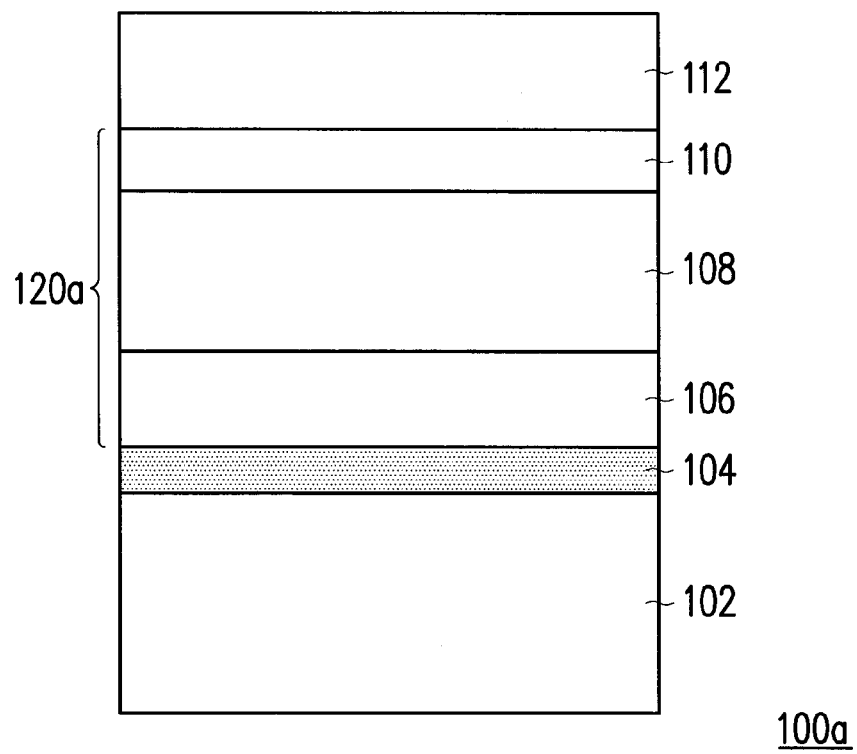
FIG. 1 is a schematic cross-sectional view of a nitride semiconductor structure of an exemplary embodiment of the disclosure.
Figure 2:
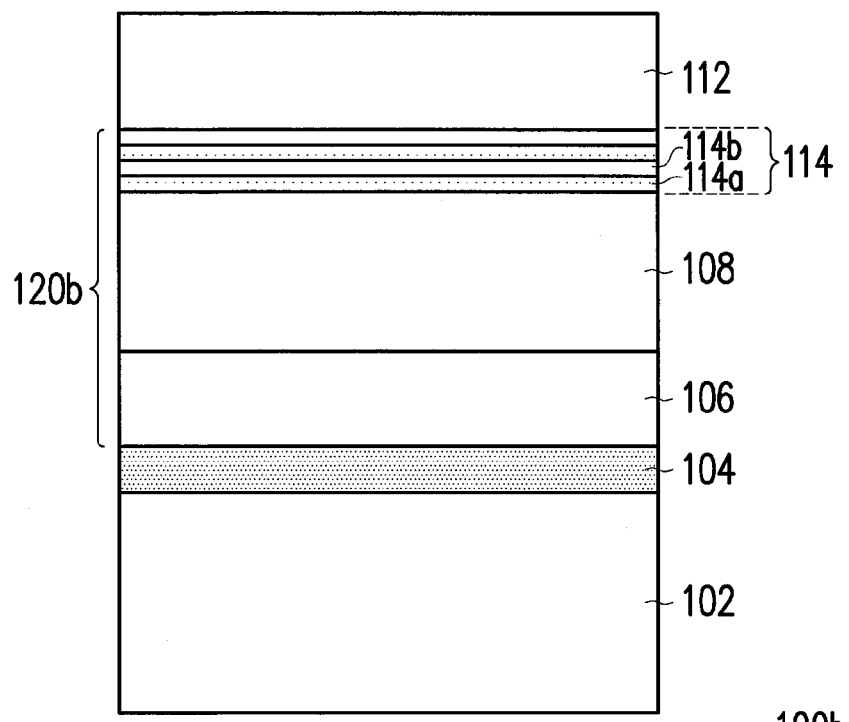
FIG. 2 is a schematic cross-sectional view of a nitride semiconductor structure of another exemplary embodiment of the disclosure.

FIG. 1 is a schematic cross-sectional view of a nitride semiconductor structure of an exemplary embodiment of the disclosure. FIG. 2 is a schematic cross-sectional view of a nitride semiconductor structure of another exemplary embodiment of the disclosure.

Referring to FIG. 1, a nitride semiconductor structure 100a of the disclosure includes a substrate 102, a silicon carbide nucleation layer 104, a composite buffer layer 120a and a nitride semiconductor layer 112. The material of the substrate 102 includes, but is not limited to, silicon, aluminium oxide ($Al_2O_3$) or glass. In one exemplary embodiment, the substrate 102 can be a silicon substrate, wherein its crystal orientation is (111). The substrate 102 may be a patterned substrate, for example, a patterned silicon substrate. The patterns of the silicon substrate may be regular or irregular micro-patterns or nano-patterns. In one exemplary embodiment, the substrate 102, after being patterned, includes a plurality of recesses (not shown) rendering the epitaxial layer (such as silicon carbide nucleation layer 104) to grow laterally on the substrate 102 and the generation of dislocation is reduced.

The silicon carbide nucleation layer 104 is located on the substrate 102. In this exemplary embodiment, the silicon carbide nucleation layer 104 may be in contact with the substrate 102; however, it should be understood that the above embodiment is presented by way of example and not by way of limitation. The silicon carbide nucleation layer 104 is formed by, for example, a chemical vapour deposition (CVD) method, wherein the reaction temperature is about 1200° C. to 1300° C. Further, the silicon carbide nucleation layer 104 may be formed on a flat silicon substrate or a patterned silicon substrate. The thickness of the silicon carbide nucleation layer 104 ranges from about 50 nanometers to about 3000 nanometers. The silicon carbide nucleation layer 104 has, for example, a cubic lattice, wherein the crystal orientation is (111), for example.

The composite buffer layer 120a is located on the silicon carbide nucleation layer 104. In this exemplary embodiment, the composite buffer layer 120a is in physical contact with the silicon carbide nucleation layer 104; however, it should be understood that the above embodiment is presented by way of example and not by way of limitation. In another exemplary embodiment (not shown), the composite buffer layer 120a and the silicon carbide nucleation layer 104 may include an intermediate layer there-between. In one exemplary embodiment, the composite buffer layer 120a at least includes a first buffer layer 106 and a second buffer layer 108. The first buffer layer 106 is in contact with the silicon carbide nucleation layer 104, for example. The first buffer layer 106 includes an $Al_xGaN$ layer, for example, wherein $0<x<1$. The first buffer layer 106 is formed by a metal organic chemical vapour deposition (MOCVD) method, wherein the reaction temperature is, for example, about 1000° C. to about 1100° C. The first buffer layer 106 is about 0.1 micron to about 3 microns thick, for example.

The second buffer layer 108 is positioned on the first buffer layer 106. In this exemplary embodiment, the second buffer layer 108 may be a bulk layer, for example an aluminium gallium nitride ($Al_yGaN$) bulk layer, wherein $0<y<1$. In one embodiment, the aluminium content of the $Al_yGaN$ bulk layer is a predetermined value. Further, the aluminium content of the $Al_xGaN$ layer in the first buffer layer 106 is greater than the aluminium content of the $Al_yGaN$ bulk layer in the second buffer layer 108. The second buffer layer 108 can be formed by a MOCVD method, wherein the reaction temperature is, for example, about 1000° C. to about 1100° C. The thickness of the second buffer layer 108 is about 0.1 micron to about 3 microns. In one exemplary embodiment, the thickness of the second buffer layer 108 is greater than that of the first buffer layer 106. The total thickness of the first buffer layer 106 and the second buffer layer 108 is between about 0.2 micron and about 4 microns. In another embodiment, the total thickness of the first buffer layer 106 and the second buffer layer 108 is between about 2 microns and about 4 microns.

In another exemplary embodiment, the composite buffer layer 120a may optically include a third buffer layer 110, as shown in FIG. 1. The third buffer layer 110 is located on the second buffer layer 108, for example. The third buffer layer 110 may serve as a stress relaxation layer for relaxing the stress between the second buffer layer 108 and the subsequently formed nitride semiconductor layer 112. In one exemplary embodiment, the third buffer layer 110 may be a single layer of a low temperature buffer layer, for example, a silicon carbide layer as shown in FIG. 1. The third buffer layer 110 can be formed by a MOCVD method, wherein the reaction temperature is between 800° C. and 900° C. The thickness of the third buffer layer 110 is between about 5 nanometers and about 100 nanometers.

Still referring to FIG. 1, the nitride semiconductor layer 112 is located on the composite buffer layer 120a. In one exemplary embodiment, the nitride semiconductor layer 112 is located on the third buffer layer 110, for example. Alternatively speaking, the third buffer layer 110 is located between the nitride semiconductor layer 112 and the second buffer layer 108. The nitride semiconductor layer 112 is formed with a gallium nitride material. The nitride semiconductor layer 112 can be formed by a MOCVD method, wherein the reaction temperature is between about 1000° C. and about 1100° C. In one exemplary embodiment, the thickness of the nitride semiconductor layer 112 is between about 1 micron and about 8 microns. In another exemplary embodiment, the thickness of the nitride semiconductor layer 112 is between about 2 microns and about 8 microns. In yet another exemplary embodiment, the thickness of the nitride semiconductor layer 112 is between about 4 microns and 8 about microns.

In the exemplary embodiment as illustrated in FIG. 1, the third buffer layer 110 is exemplified as a single layer. However, it should be understood that the above embodiments are presented by way of example and not by way of limitation. In another exemplary embodiment, the third buffer layer may be a multi-layer structure, for example, the third buffer layer 114 as illustrated in FIG. 2. The third buffer layer 114 may include a superlattice structure containing a plurality of silicon carbide layers 114a and a plurality of gallium nitride layers 114b alternately arranged with each other. The third buffer layer 114 can be formed by a MOCVD method, wherein the reaction temperature is between about 800° C. and about 900° C. The third buffer layer 114 is about 5 nanometers to about 50 nanometers thick. It is noted that only some of the layers of the superlattice structure is exemplified in FIG. 2, and the number of the silicon carbide layers 114a and the number of the gallium nitride layers 114b are not limited thereto.

It is noted that in the nitride semiconductor structures 100a and 100b of the disclosure, a silicon carbide nucleation layer 104 is used to replace the conventional aluminium nitride layer, in which the long epitaxy process of aluminium nitride, leading to a low throughput of the equipment can be obviated. Further, in the composite buffer layers 120a and 120b of the disclosure, the lower first buffer layer 106 (which is the $Al_x$GaN layer) has a higher aluminium content, which can compensate the surface defects of the silicon carbide nucleation layer 104 to improve the quality of the epitaxial layer. Further, in the composite buffer layer 120a of the disclosure, the upper second buffer layer 108 (which is the $Al_y$GaN layer) has a lower aluminium content, which can provide a compress strain to reduce the generation of tensile stress resulted from the difference in the thermal expansion coefficients between gallium nitride and silicon, thereby preventing the rupture of wafers. Alternatively speaking, the nitride semiconductor structures 100a and 100b of the disclosure are aluminium nitride free semiconductor structures, in which the epitaxy process time is reduced and the frequency of preventive maintenance (PM) of the equipment is also reduced.

Further, in the nitride semiconductor structures 100a and 100b as shown in FIGS. 1 and 2, the second buffer layer 108 is a bulk layer; however, it should be understood that the above embodiments are presented by way of example and not by way of limitation. In other exemplary embodiments, the second buffer layer may be a graded layer or a superlattice structure, as shown in FIGS. 3 and 4.

Figure 3:
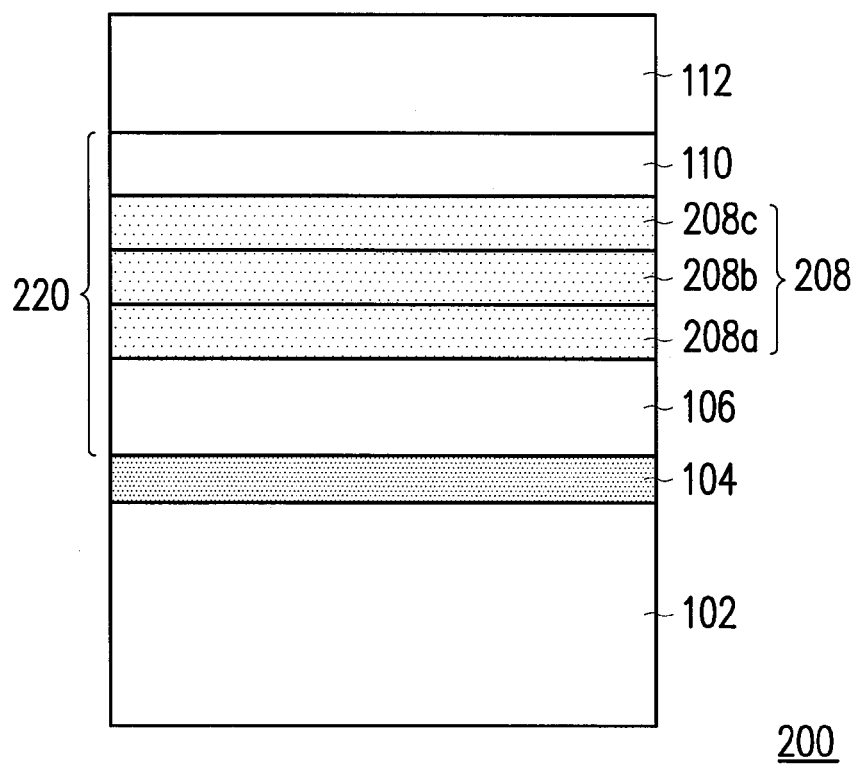
FIG. 3 is a schematic cross-sectional view of a nitride semiconductor structure of another exemplary embodiment of the disclosure.
Figure 4:
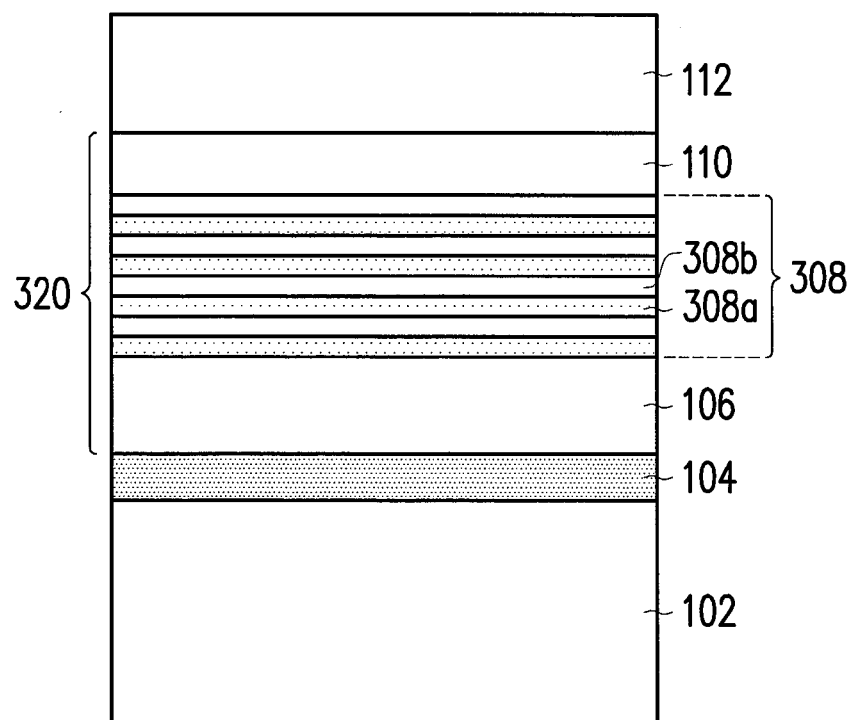
FIG. 4 is a schematic cross-sectional view of a nitride semiconductor structure of another exemplary embodiment of the disclosure.

FIG. 3 is a schematic cross-sectional view of a nitride semiconductor structure of another exemplary embodiment of the disclosure. The difference between the nitride semiconductor structure 200 in FIG. 3 and the nitride semiconductor structure 100a in FIG. 1 lies in that the compositions of the second buffer layers are different.

Referring to FIG. 3, the nitride semiconductor structure 200 of the disclosure includes a substrate 102, a silicon nitride nucleation layer 104, a composite buffer layer 220 and a nitride semiconductor layer 112. The composite buffer layer 220 includes a first buffer layer 106, a second buffer layer 208 and an optional third buffer layer 110. The materials and the forming methods of substrate 102, the silicon carbide nucleation layer 104, the first buffer layer 106, the third buffer layer 110 and the nitride semiconductor layer 112 are similar to those discussed above and will not be further reiterated herein. Further, in the structure as shown in FIG. 3, the third buffer layer 110 is exemplified as a single-layer structure; however, it should be noted that this embodiment is only presented by way of example and not by way of limitation. In other exemplary embodiments, the third buffer layer 110 may be a multi-layer structure or a superlattice structure.

The second buffer layer 208 is located on the first buffer layer 106. The second buffer layer 208 includes a plurality of graded layers, for example, the content of the aluminium gradually changes in the aluminium gallium nitride ($Al_y$GaN) layer, wherein 0<y<1. In one exemplary embodiment, the second buffer layer 208 includes a graded aluminium gallium nitride layer with step graded aluminium content. As shown in FIG. 3, the second buffer layer 208 may include (but is not limited to) a sub-buffer layer 208a, a sub-buffer layer 208b and a sub-buffer layer 208c. The aluminium contents of sub-buffer layers 208a, 208b and 208c decrease in a stepwise manner. For example, the aluminium content of the sub-buffer layer 208a is greater than the aluminium content of the sub-buffer layer 208b, and the aluminium content of the sub-buffer layer 208b is greater than that of the sub-buffer layer 208c; however, it should be understood that the above embodiment is presented by way of example and not by way of limitation. In another exemplary embodiment, the aluminium contents of sub-buffer layers 208a, 208b and 208c increase in a stepwise manner. In yet another exemplary embodiment, the second buffer layer 208 includes a graded aluminium gallium nitride layer with continuously graded aluminium content; for example, the aluminium content reduces along the thickness of the graded aluminium gallium nitride layer; however, it should be understood that the above embodiment is presented by way of example and not by way of limitation. In another exemplary embodiment, the aluminium content increases along the thickness of the graded aluminium gallium nitride layer. In an exemplary embodiment, the aluminium content of the first buffer layer 106 (that is the $Al_x$GaN layer) is greater than the maximum aluminium content of the second buffer layer 208 (that is the graded $Al_y$GaN layer). In another exemplary embodiment, the aluminium content of the first buffer layer 106 (that is the $Al_x$GaN layer) is greater than the average aluminium content of the second buffer layer 108 (that is the graded $Al_y$GaN layer).

In the composite buffer layer 220 as illustrated in FIG. 3, the lower first buffer layer 106 (which is the $Al_x$GaN layer) has a higher aluminium content, which can compensate the surface defects of the silicon carbide nucleation layer 104 to improve the quality of the epitaxial layer. Moreover, in the composite buffer layer 220, the upper second buffer layer 108 includes a graded aluminium gallium layer in which the aluminium content gradually changes to reduce the stress generated between gallium nitride and silicon due to the difference in the thermal expansion coefficients. Further, the nitride semiconductor structure 200 of the disclosure is an aluminium nitride free semiconductor structure; therefore, the epitaxy process time is reduced and the frequency of preventive maintenance of the equipment is also reduced.

FIG. 4 is a schematic cross-sectional view of a nitride semiconductor structure of another exemplary embodiment of the disclosure. The difference between the nitride semiconductor structure 300 in FIG. 4 and the nitride semiconductor structure 100a in FIG. 1 lies in that the compositions of the second buffer layers are different.

Referring to FIG. 4, the nitride semiconductor structure 300 of the disclosure includes a substrate 102, a silicon nitride nucleation layer 104, a composite buffer layer 320 and a nitride semiconductor layer 112. The composite buffer layer 320 includes a first buffer layer 106, a second buffer layer 308 and an optional third buffer layer 110. The materials and the forming methods of substrate 102, the silicon carbide nucleation layer 104, the first buffer layer 106, the third buffer layer 110 and the nitride semiconductor layer 112 are similar to those discussed above and will not be further reiterated herein. Further, in the structure as shown in FIG. 4, the third buffer layer 110 is exemplified as a single-layer structure; however, it should be noted that it is only presented by way of example and not by way of limitation. In other exemplary embodiments, the third buffer layer may be a multi-layer or a superlattice structure.

The second buffer layer 308 is located on the first buffer layer 106. The second buffer layer 308 includes a superlattice structure containing a plurality of $Al_yGa_{1-y}N$ layers 308a and a plurality of $Al_zGa_{1-z}N$ layers 308b alternately arranged with each other, wherein 0<y<1, 0<z<1 and y is not equal to z. It is noted that only some of the layers of the superlattice structure are exemplified in FIG. 4, and the number of the $Al_yGa_{1-y}N$ layers 308a and the number of the $Al_zGa_{1-z}N$ layers 308b are not limited thereto. Further, the average aluminium content of the second buffer layer 308 is less the aluminium content of the first buffer layer 106. In other words, the relationship of the aluminium contents of the $Al_xGaN$ layer, the $Al_yGa_{1-y}N$ layer 308a and the $Al_zGa_{1-z}N$ layer 308b is represented by the mathematical expression x>(y+z)/2. In one exemplary embodiment, the aluminium content of the first buffer layer 106 (which is $Al_xGaN$ layer) is greater than the maximum of the aluminium contents of the $Al_yGa_{1-y}N$ layer 308a and the $Al_zGa_{1-z}N$ layer 308b.

In the composite buffer layer 320 in FIG. 4, the lower first buffer layer 106 (which is the $Al_xGaN$ layer) contains a higher aluminium content, which can compensate the surface defects of the silicon carbide nucleation layer 104 to improve the quality of the epitaxial layer. Further, in the composite buffer layer 320, the upper second buffer layer 308 has a superlattice structure (which contains $Al_yGa_{1-y}N$ layers/$Al_zGa_{1-z}N$ layers) and the average aluminium content of the second buffer layer 308 is less than the aluminium content of the first buffer layer 106 so that the stress generated due to the difference of the thermal expansion coefficients between gallium nitride and silicon is reduced. Further, the nitride semiconductor structure 300 of the disclosure is an aluminium nitride free semiconductor structure, in which the epitaxy process time is reduced and the frequency of preventive maintenance of the equipment is also reduced.

In the nitride semiconductor structures 100a, 100b, 200 and 300 as illustrated in FIGS. 1 to 4, the first buffer layer 106 is a single layer and an aluminium nitride free structure; it should be understood that the above embodiments are presented by way of example and not by way of limitation. In another exemplary embodiment, the first buffer layer may be a multi-layer structure and optionally contains aluminium nitride, as shown in FIG. 5.

Figure 5:
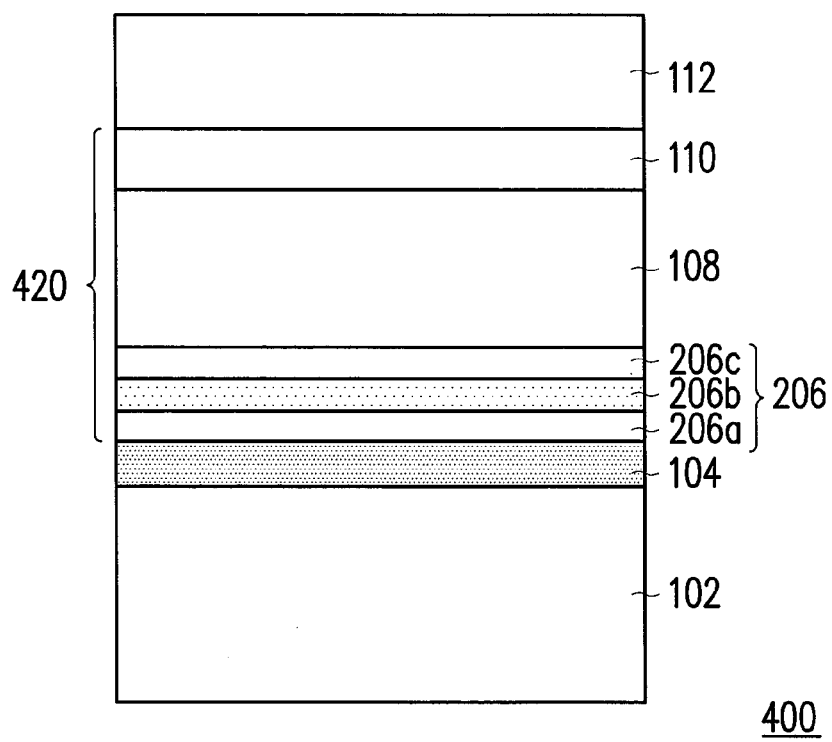
FIG. 5 is a schematic cross-sectional view of a nitride semiconductor structure of another exemplary embodiment of the disclosure.

FIG. 5 is a schematic cross-sectional view of a nitride semiconductor structure of another exemplary embodiment of the disclosure. The difference between the nitride semiconductor structure 400 in FIG. 5 and the nitride semiconductor structure 100a in FIG. 1 lies in that the structures of the first buffer layers are different.

Referring to FIG. 5, the nitride semiconductor structure 400 of the disclosure includes a substrate 102, a silicon carbide nucleation layer 104, a composite buffer layer 420 and a nitride semiconductor layer 112. The composite buffer layer 420 includes a first buffer layer 206, a second buffer layer 108 and an optional third buffer layer 110. The materials and the forming methods of the substrate 102, the silicon carbide nucleation layer 104 and the nitride semiconductor layer 112 are similar to those discussed above and will not be further reiterated herein. Further, in the structure as shown in FIG. 5, the second buffer layer 108 and the optional third buffer layer 110 are respectively exemplified as a single-layer structure; however, it should be noted that the embodiment is only presented by way of example and not by way of limitation. Alternatively speaking, the second buffer layer 108 may include a plurality of graded layers as the illustrated nitride semiconductor structure 200 or may include a supperlattice structure as the illustrated nitride semiconductor structure 300, and the optional third buffer layer 110 may be a superlattice structure as in the illustrated nitride semiconductor structure 100b.

Still referring to FIG. 5, the first buffer layer 206 includes an $Al_xGaN$ layer and an AlN layer, wherein 0<x<1. In one exemplary embodiment, the first buffer layer 206 may include (but is not limited to) an $Al_xGaN$ layer 20ba, an AlN layer 206b and an $Al_xGaN$ layer 206c. The AlN layer 206b is, for example, located between the $Al_xGaN$ layers 206a and 206c; however, it should be noted that the disclosure is not limited as such. The compositions of the $Al_xGaN$ layers 206a and 206c may be the same or different. In one exemplary embodiment, the aluminium content of the first buffer layer 206 is greater than that of the second buffer layer 108. The method used in forming the $Al_xGaN$ layer 206a, the AlN layer 206b and the $Al_xGaN$ layer 206c includes a MOCVD method, wherein the reaction temperature is about 1000° C. to about 1100° C. The thicknesses of each of the $Al_xGaN$ layers 206a and 206c is about 0.5 microns to about 2 microns, for example. The thickness of the AlN layer 206b is about 0.01 micron to about 0.05 micron, for example.

In the exemplary embodiment of FIG. 5, in addition to the higher aluminium content of the first buffer layer 206 for compensating the surface defects of the silicon carbide nucleation layer 104, the disposition of the AlN layer 206b in between the $Al_xGaN$ layers 206a and 206c further enhances the overall uniformity of the nitride semiconductor structure 400; hence, the stress compensation characteristics of the structure is enhanced to thereby improve the incompatibilities of the lattices and the thermal expansion coefficients between gallium nitride and silicon.

Figure 6:
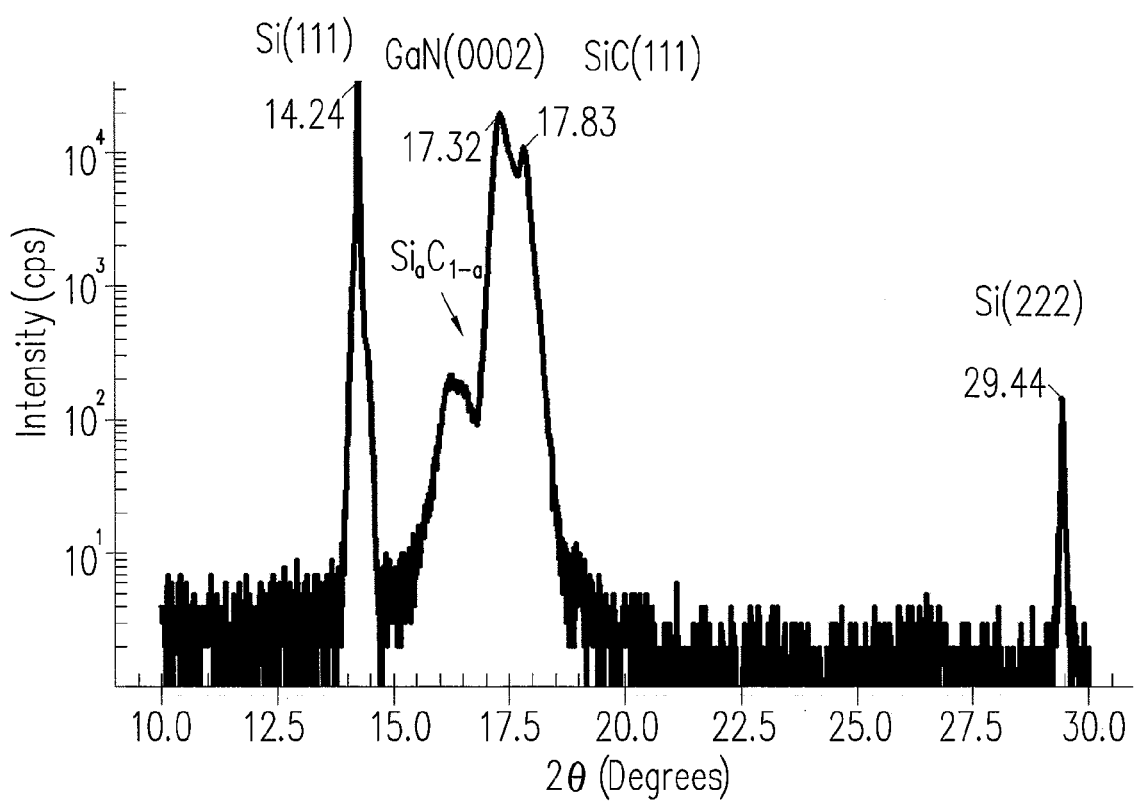
FIG. 6 is an X-ray diffraction pattern of a nitride semiconductor structure of another exemplary embodiment of the disclosure.

FIG. 6 is an X-ray diffraction pattern of a nitride semiconductor structure of an exemplary embodiment of the disclosure.

The nitride semiconductor structure of an exemplary embodiment of the disclosure includes a silicon substrate, a silicon carbide nucleation layer, a composite buffer layer and a nitride semiconductor layer. The thickness of the silicon carbide nucleation layer is about 300 nanometers. The composite buffer layer is a graded aluminium gallium nitride layer with continuously graded aluminium content and has a thickness of about 2 microns. The thickness of the nitride semiconductor layer is about 2 microns.

Referring to FIG. 6, at the position where the diffraction angle (2θ) is 14.24 degrees, the Si(111) plane is observed. At the position where the diffraction angle is 17.32 degrees, the GaN (0002) plane is observed. At the position where the diffraction angle is 17.83 degrees, the SiC (111) plane is observed. At the position where the diffraction angle is 16.5 degrees, the peak of $Si_aC_{1-a}$ is observed, and this peak demonstrates that a transition layer is present between the silicon substrate and the nucleation layer. According to the above results, with the silicon carbide nucleation layer and the composite buffer layer of the disclosure, a gallium nitride semiconductor layer can be successfully grown on a silicon substrate.

Based on the above, in the nitride semiconductor structure of the disclosure, through the disposition of the silicon carbide nucleation layer and the composite buffer layer, the incompatibilities of the lattices and the thermal coefficients between gallium nitride and silicon are improved to resolve the problem of excessive defects present there-between. Moreover, the composite buffer layer of the disclosure may be a multi-layer structure, a graded layer, a superlattice structure or a combination thereof, and the average aluminium content of the upper layer(s) is less than the average aluminium content of the lower layer(s) to reduce the stress generated due the difference in the thermal expansion coefficients between gallium nitride and silicon. Further, the conventional nitride semiconductor structure typically includes aluminium nitride; the epitaxy process time in forming aluminium nitride by MOCVD is long, resulting in a low throughput of the equipment. According to the disclosure, a nitride semiconductor structure, which is aluminium nitride free, is provided, in which the epitaxy process time is reduced and the frequency of preventive maintenance of the equipment is also reduced.

The foregoing description of the exemplary embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical disclosure, thereby to enable persons skilled in the art to understand the invention for various embodiments and with various modifications as are suited to the particular use or implementation contemplated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A nitride semiconductor structure comprising:
    a substrate;
    a silicon carbide nucleation layer, located on the substrate;
    a composite buffer layer, located on the silicon carbide nucleation layer; and
    a nitride semiconductor layer, located on the composite buffer layer,
    wherein the nitride semiconductor structure is an aluminum nitride free (AlN free) semiconductor structure,
    wherein the composite buffer layer comprises a first buffer layer and a second buffer layer, and the first buffer layer is in contact with silicon carbide nucleation layer, and
    wherein the first buffer layer comprises an $Al_xGaN$ layer, and $0<x<1$.

2. The nitride semiconductor structure according to claim 1, wherein the second buffer layer comprises a plurality of $Al_yGa_{1-y}N$ layers and a plurality of $Al_zGa_{1-z}N$ layers alternately arranged with each other, and $0<y<1$, $0<z<1$, and y is not equal to z.

3. The nitride semiconductor structure according to claim 2, wherein $x>(y+z)/2$.

4. The nitride semiconductor structure according to claim 1, wherein the second buffer layer comprises an aluminum gallium nitride bulk layer.

5. The nitride semiconductor structure according to claim 1, wherein the second buffer layer comprises a graded aluminum gallium nitride layer with step graded aluminum content.

6. The nitride semiconductor structure according to claim 1, wherein the second buffer layer comprises a graded aluminum gallium nitride layer with continuously graded aluminum content.

7. The nitride semiconductor structure according to claim 1, wherein the composite buffer layer further comprises a third buffer layer positioned between the nitride semiconductor layer and the second buffer layer.

8. The nitride semiconductor structure according to claim 7, wherein the third buffer layer comprises a silicon carbide layer.

9. The nitride semiconductor structure according to claim 7, wherein the third buffer layer comprises a plurality of silicon carbide layers and a plurality of gallium nitride layers alternately arranged with each other.

10. The nitride semiconductor structure according to claim 7, wherein a thickness of the third buffer layer is between about 5 nanometers and about 100 nanometers.

11. The nitride semiconductor structure according to claim 1, wherein the silicon carbide nucleation layer has a cubic lattice.

12. The nitride semiconductor structure according to claim 1, wherein a thickness of the silicon carbide nucleation layer is between about 50 nanometers and about 3000 nanometers.

13. The nitride semiconductor structure according to claim 1, wherein a thickness of the first buffer layer is between about 0.1 micron and about 3 microns.

14. The nitride semiconductor structure according to claim 1, wherein a thickness of the second buffer layer is between about 0.1 micron and about 3 microns.

15. The nitride semiconductor structure according to claim 1, wherein a combined thickness of the first buffer layer and the second buffer layer is between about 0.2 microns and about 4 microns.

16. The nitride semiconductor structure according to claim 1, wherein a material of the substrate comprises silicon, aluminum oxide or glass.

17. The nitride semiconductor structure according to claim 1, wherein the substrate is a patterned substrate.

18. The nitride semiconductor structure according to claim 1, wherein a thickness of the nitride semiconductor layer is between about 1 micron and about 8 microns.

* * * * *